(12) United States Patent
Qian et al.

(10) Patent No.: US 12,368,371 B2
(45) Date of Patent: Jul. 22, 2025

(54) NON-ISOLATED RESONANT GATE DRIVE CIRCUIT

(71) Applicant: SOUTHEAST UNIVERSITY, Nanjing (CN)

(72) Inventors: Qinsong Qian, Nanjing (CN); Ziyan Zhou, Nanjing (CN); Qiang Luo, Nanjing (CN); Qi Liu, Nanjing (CN); Song Ding, Nanjing (CN); Weifeng Sun, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/850,589

(22) PCT Filed: Mar. 20, 2024

(86) PCT No.: PCT/CN2024/082561
§ 371 (c)(1),
(2) Date: Sep. 25, 2024

(87) PCT Pub. No.: WO2025/112236
PCT Pub. Date: Jun. 5, 2025

(65) Prior Publication Data
US 2025/0183785 A1    Jun. 5, 2025

(30) Foreign Application Priority Data
Nov. 30, 2023    (CN) .......................... 202311616650.4

(51) Int. Cl.
H03K 3/00        (2006.01)
H02M 1/00       (2006.01)
(Continued)

(52) U.S. Cl.
CPC ........... *H02M 1/08* (2013.01); *H02M 1/0054* (2021.05); *H02M 3/01* (2021.05); *H03K 17/162* (2013.01);
(Continued)

(58) Field of Classification Search
None
See application file for complete search history.

(56) References Cited

U.S. PATENT DOCUMENTS

| 6,456,167 | B1* | 9/2002 | Huang ................. H03B 5/1228 331/46 |
| 2003/0062930 | A1 | 4/2003 | Li et al. |
| 2004/0092241 | A1* | 5/2004 | Kim ....................... H03D 3/009 455/255 |

FOREIGN PATENT DOCUMENTS

| CN | 109980903 A | 7/2019 |
| CN | 115313803 A | 11/2022 |

(Continued)

*Primary Examiner* — Kenneth B Wells
(74) *Attorney, Agent, or Firm* — Bayramoglu Law Offices LLC

(57) ABSTRACT

A non-isolated resonant gate drive circuit includes a PMOS drive network, an NMOS clamping circuit and an inductor. The PMOS drive network and the NMOS clamping circuit are connected in parallel to two terminals of the inductor. Input signals of the PMOS drive network are provided by a function generator connected to a drive chip, drive signals are output via an output port $v_{gsr1}$ and an output port $v_{gsr2}$ after the input signals are processed by the PMOS drive network, the NMOS clamping circuit and the inductor, the NMOS clamping circuit is used for controlling the state of the output port $v_{gsr1}$ and the output port $v_{gsr2}$ to change, and the inductor forms LC resonance together with a gate capacitor $C_{gsr1}$ and a gate capacitor $C_{gsr2}$ in the NMOS clamping circuit to recover energy in a process of turning off the drive circuit.

3 Claims, 5 Drawing Sheets

(51) Int. Cl.
  *H02M 1/08*       (2006.01)
  *H02M 3/00*       (2006.01)
  *H03K 17/16*      (2006.01)
  *H03K 17/687*     (2006.01)
  *H02M 3/335*      (2006.01)
(52) U.S. Cl.
  CPC .... *H02M 3/33573* (2021.05); *H02M 3/33592* (2013.01)

(56) References Cited

FOREIGN PATENT DOCUMENTS

| | | |
|---|---|---|
| CN | 116345859 A | 6/2023 |
| CN | 116780865 A | 9/2023 |
| CN | 117650689 A | 3/2024 |

* cited by examiner $t_0$-$t_1$ $t_1$-$t_2$ $t_2$-$t_4$ $t_4$-$t_5$ $t_5$-$t_6$ $t_6$-$t_8$

NON-ISOLATED RESONANT GATE DRIVE CIRCUIT

CROSS-REFERENCE TO THE RELATED APPLICATIONS

This application is the national phase entry of International Application No. PCT/CN2024/082561, filed on Mar. 20, 2024, which is based upon and claims priority to Chinese Patent Application No. 202311616650.4, filed on Nov. 30, 2023, the entire contents of which are incorporated herein by reference.

TECHNICAL FIELD

The invention belongs to the technical field of power transistor drive, and particularly relates to a non-isolated resonant gate drive circuit.

BACKGROUND

The increase in the frequency of switching power supplies allows for the use of smaller inductors and capacitors in circuits, thus reducing the size of a power system and also reducing the production cost. However, high-frequency switching will lead to an increase in the proportion of the switching loss of power transistors in the overall power loss as well as an increase in the total loss. So, the reduction of the drive loss of power transistors becomes a key to decreasing the loss of high-frequency switching power supplies and increasing the power density of the high-frequency switching power supplies.

Energy of traditional gate drive circuits is consumed by resistors on a charge-discharge path, and a resonant gate drive circuit is an efficient drive circuit with an energy recovery function. Of existing power transistor resonant gate drive techniques, a dual-channel resonant gate drive circuit uses four switching transistors and inductors connected across the midpoint of a bridge arm and can. It can output two symmetric drive signals and recover a large proportion of energy. However, four signals are needed to control the switching transistors, leading to a difficulty in matching of the control signals and reducing the stability of output drive signals. According to a transformer-based magnetically-isolated resonant gate drive technique, a transformer is added to a drive circuit, and an output drive signal can synchronously drive an upper transistor and a lower transistor of a half bridge, thus realizing a floating function of the drive signal; however, the use of the transformer increases the complexity of the circuit and enlarges the space occupied by the circuit.

SUMMARY

The objective of the invention is to provide a non-isolated resonant gate drive circuit to solve the technical problem that existing drive techniques have a low energy recovery rate, a large number of control signals, a difficulty in signal matching and a large occupied space and are not beneficial to miniaturization.

To fulfill the above objective, the invention adopts the following technique solution: a non-isolated resonant gate drive circuit comprises a P-channel metal oxide semiconductor (PMOS) drive network, an N-channel metal oxide semiconductor (NMOS) clamping circuit and an inductor, the PMOS drive network and the NMOS clamping circuit being connected in parallel to two terminals of the inductor; wherein, input signals of the PMOS drive network are provided by a function generator connected to a drive chip, drive signals are output via an output port $v_{gsr1}$ and an output port $v_{gsr2}$ after the input signals are processed by the PMOS drive network, the NMOS clamping circuit and the inductor, the NMOS clamping circuit is used for controlling a state of the output port $v_{gsr1}$ and the output port $v_{gsr2}$ to change, the inductor forms LC resonance together with a gate capacitor $C_{gsr1}$ and a gate capacitor $C_{gsr2}$ in the NMOS clamping circuit to recover energy in a process of turning off the drive circuit, and the recovered energy is used in a process of turning on the drive circuit.

Further, the PMOS drive network comprises a first PMOS transistor and a second PMOS transistor, a source of the first PMOS transistor and a source of the second PMOS transistor are both connected to a power supply Vcc, a gate of the first PMOS transistor is connected to a pulse width modulation (PWM) 1 output port of the drive chip connected to the function generator, a drain of the first PMOS transistor is connected to one terminal of the inductor, a gate of the second PMOS transistor is connected to a PWM2 output port of the drive chip connected to the function generator, and a drain of the second PMOS transistor is connected to the other terminal of the inductor.

Further, the NMOS clamping circuit comprises a first NMOS transistor, a second NMOS transistor, the gate capacitor $C_{gsr1}$ and the gate capacitor $C_{gsr2}$, a gate of the first NMOS transistor is connected to a drain of the second NMOS transistor, the other terminal of the inductor, the output port $v_{gsr2}$, a drain of a second PMOS transistor and one terminal of the gate capacitor $C_{gsr2}$, a drain of the first NMOS transistor is connected to a gate of the second NMOS transistor, one terminal of the inductor, the output port $v_{gsr1}$, a drain of a first PMOS transistor and one terminal of the gate capacitor $C_{gsr1}$, a source of the first NMOS transistor is connected to the other terminal of the gate capacitor $C_{gsr1}$ and ground (GND), the gate of the second NMOS transistor is connected to one terminal of the inductor, the output port $v_{gsr1}$, the drain of the first PMOS transistor and the gate capacitor $C_{gsr1}$, the drain of the second NMOS transistor is connected to the other terminal of the inductor, the output port $v_{gsr2}$, the drain of the second PMOS transistor and one terminal of the gate capacitor $C_{gsr2}$, a source of the second NMOS transistor is connected to the other terminal of the gate capacitor $C_{gsr2}$ and GND, one terminal of the gate capacitor $C_{gsr1}$ is connected to one terminal of the inductor, the output port $v_{gsr1}$ and the drain of the first PMOS transistor, and one terminal of the gate capacitor $C_{gsr2}$ is connected to the other terminal of the inductor, the output port $v_{gsr2}$ and the drain of the second PMOS transistor.

Further, the output port $v_{gsr1}$ is connected to one terminal of the inductor and a drain of a first PMOS transistor, and the output port $v_{gsr1}$ is connected to the other terminal of the inductor and a drain of a second PMOS transistor.

Beneficial Effects

1. According to the invention, the number of devices is small, the entire non-isolated resonant gate drive circuit is formed by two PMOS transistors, two NMOS transistors and an inductor, the magnetic element only comprises an inductor, and a transformer is not needed, such that the cost and space are reduced, and miniaturization and integration are facilitated.

2. Control signals in the invention are simple, the function generator connected to the drive chip provides two square signals with a phase difference of 180° and the same frequency and duty cycle to control the two PMOS drive transistors, and it is unnecessary to provide control signals for the two NMOS transistors, such that the complexity of the control signals is simplified, and the stability of the system is improved.

DETAILED DESCRIPTION OF THE EMBODIMENTS

The invention is further explained below in conjunction with the accompanying drawings.

Figure 1:
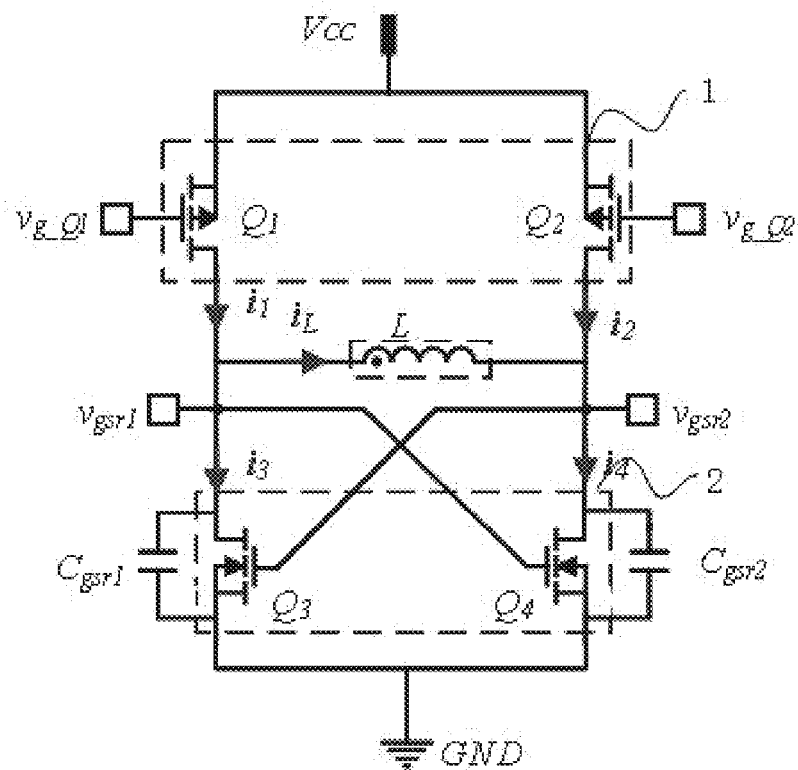
FIG. 1 is a diagram of a circuit according to the invention.

As shown in FIG. 1, the invention provides a non-isolated resonant gate drive circuit, comprising a PMOS drive network 1, an NMOS clamping circuit 2 and an inductor L; a function generator is connected to a drive chip and generates input signals PWM1 and PWM2, the input signal PWM1 controls a first PMOS transistor Q1, and the input signal PWM2 controls a second PMOS transistor Q2, wherein a phase difference between the input signals PWM1 and PWM2 is 180°, and the frequency and duty cycle of the input signals PWM1 and PWM2 are adjustable according to a driven circuit; the NMOS clamping circuit 2 allows for a voltage output range 0-Vcc of ports $v_{gsr1}$ and $v_{gsr2}$ for outputting drive signals and also participate in the resonance process to change the state of the output ports $v_{gsr1}$ and $v_{gsr2}$; the inductor L functions for transmitting energy during the resonance and excitation process of the non-isolated resonant gate drive circuit and forms LC resonance together with a gate capacitor Can and a gate capacitor $C_{gsr2}$ in the NMOS clamping circuit 2 to recover energy in the process of turning off the drive circuit, and the recovered energy is used in the process of turning on the drive circuit.

Figure 2:
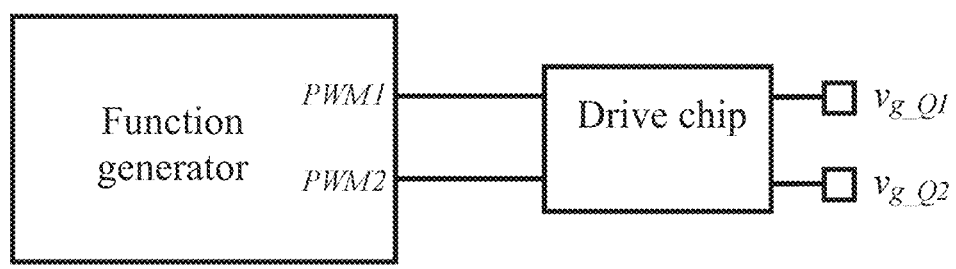
FIG. 2 is a diagram of a control signal input module according to the invention.

As shown in FIG. 2, which illustrates a control signal input module of the invention, the function generator provides square signals PWM1 and PWM2 with an adjustable frequency and duty cycle. The two input signals are provided to input ports of the non-isolated resonant gate drive circuit by means of the drive chip: a gate vg Q1 of the first PMOS transistor $Q_1$ and a gate $v_{g\_Q2}$ of the second PMOS transistor Q2.

Figure 3:
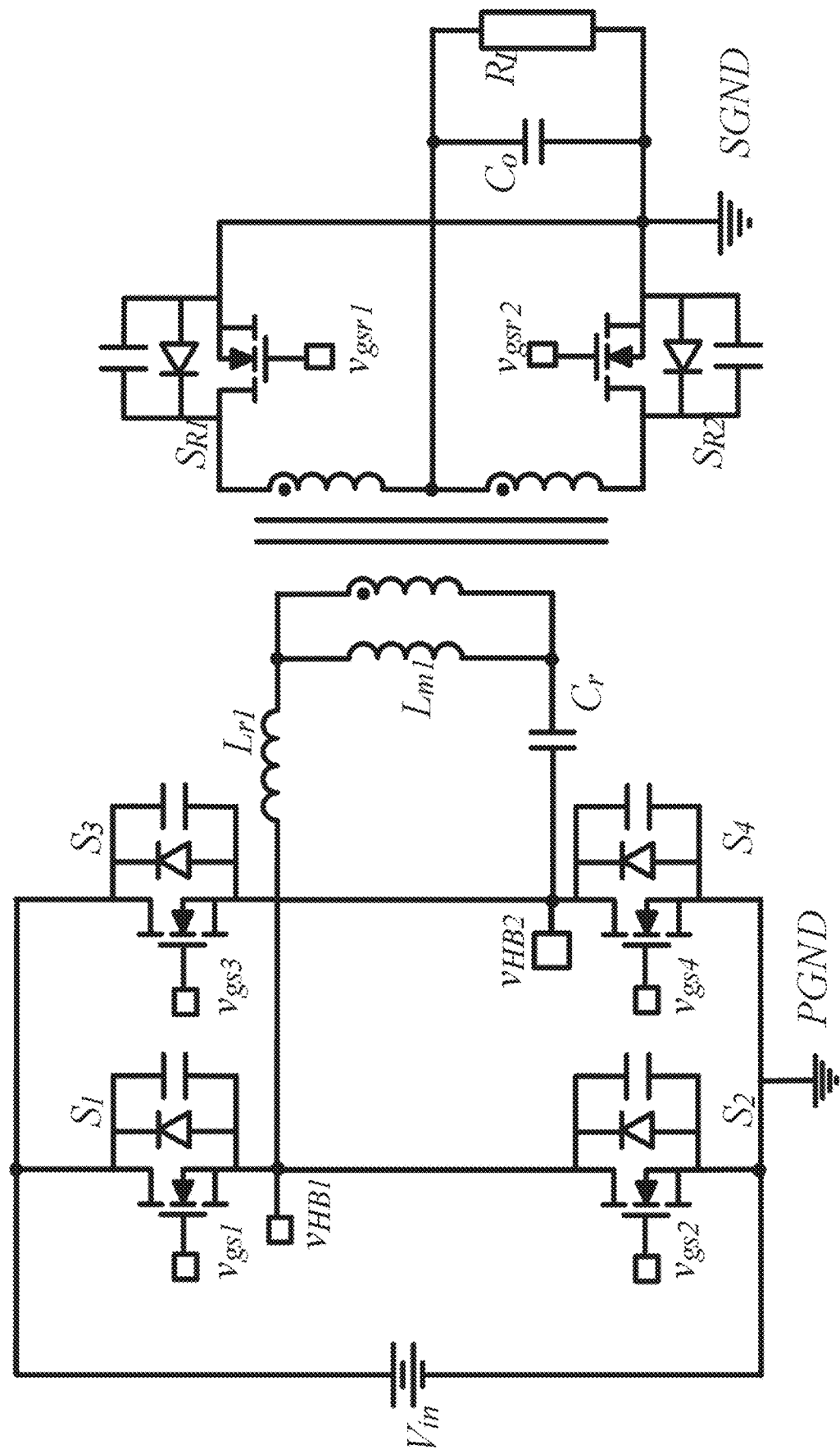
FIG. 3 is a circuit diagram of a suitable LLC direct-current transformer according to the invention.

As shown in FIG. 3 which illustrates a suitable LLC direct-current transformer according to the invention, output signals in the invention can provide gate drive signals for low-voltage side switching transistors of a full bridge on a primary side and synchronous rectifying transistors on a secondary side of the LLC direct-current transformer. Output signals $v_{gsr1}$ and $v_{gsr2}$ in FIG. 1 correspond to gate signals $v_{gs2}$ and $v_{gs4}$ Of $v_{gsr1}$ and $v_{gsr2}$ in FIG. 3 and controls low-voltage side switching transistors $S_2$ and $S_4$ of the full bridge on the primary side to be turned on or off and transistors $S_{R1}$ and $S_{R2}$ on the secondary side to realize a rectification function. Switching transistors $S_1$, $S_2$, $S_3$ and $S_4$ form a full-bridge topological structure, $L_{r1}$ and $L_{r2}$ are leakage inductance of the transformer, $L_{m1}$ and $L_{m2}$ are excitation inductance of the transformer, $C_r$ is a resonant capacitor, $S_{R1}$ and $S_{R2}$ are the synchronous rectifying transistors on the secondary side, $C_o$ is an output capacitor, and $R_L$ is a load.

Figure 4:
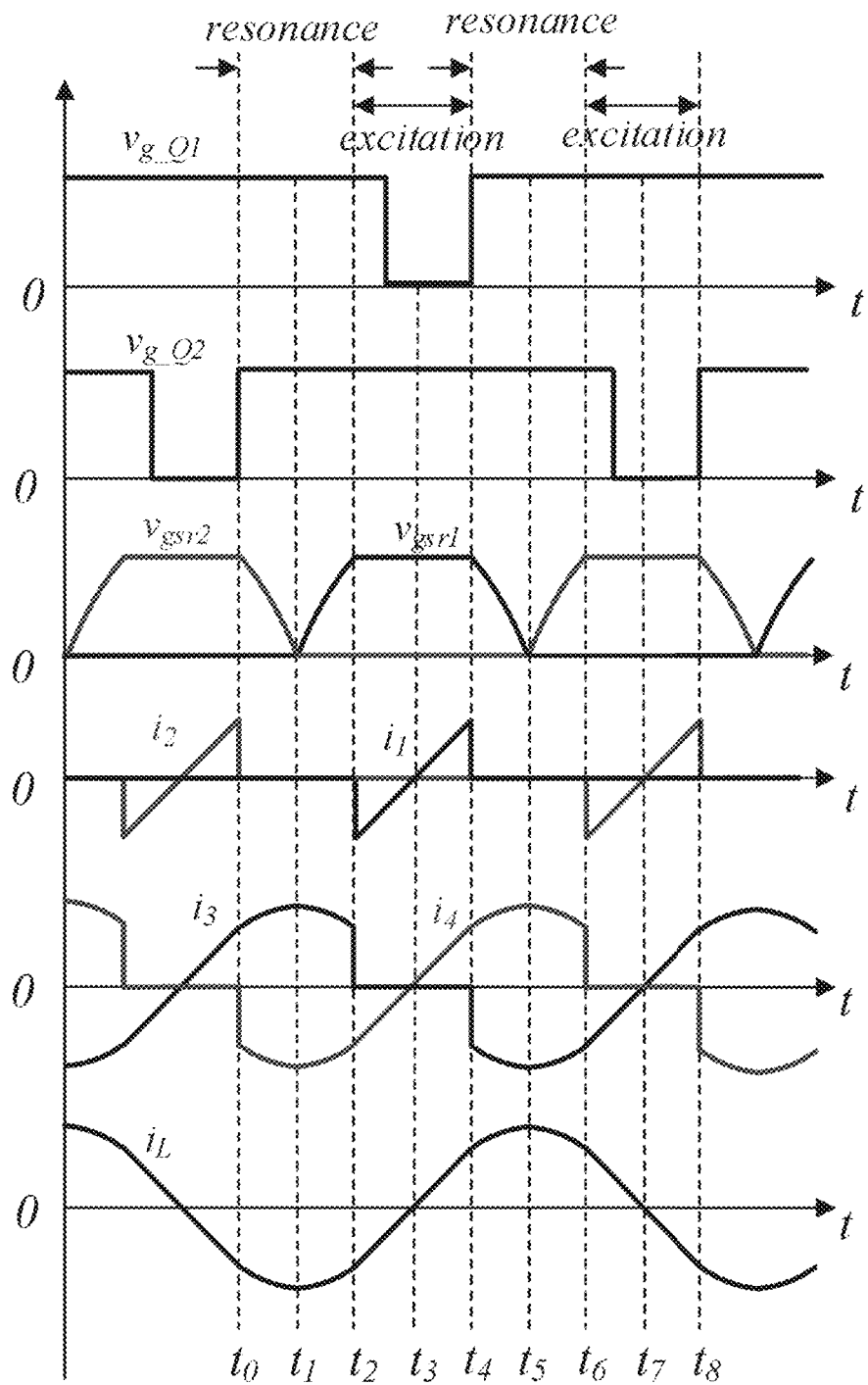
FIG. 4 is a timing diagram of key waveforms of the circuit according to the invention.

As shown in FIG. 4 which is a timing diagram of key waveforms of the circuit in FIG. 1, comprising control signals, output voltage signals and key currents. The first row is a gate control signal of the first PMOS transistor $Q_1$, the second row is a gate control signal of the second PMOS transistor $Q_2$, the third row is drive signals output by the output ports $v_{gsr1}$ and $v_{gsr2}$, $i_1$ in the fourth row is a current across the first PMOS transistor $Q_1$, $i_2$ in the fourth row is a current across the second PMOS transistor $Q_2$, $i_3$ in the fifth row is a current across a first NMOS transistor $Q_3$ and the gate capacitor $C_{gsr1}$, $i_4$ in the fifth row is a current across a second NMOS transistor $Q_4$ and the gate capacitor $C_{gsr2}$, and $i_L$ in the sixth row is a current across the inductor 3, wherein the current direction indicated in FIG. 1 is a positive current direction.

Figure 5:
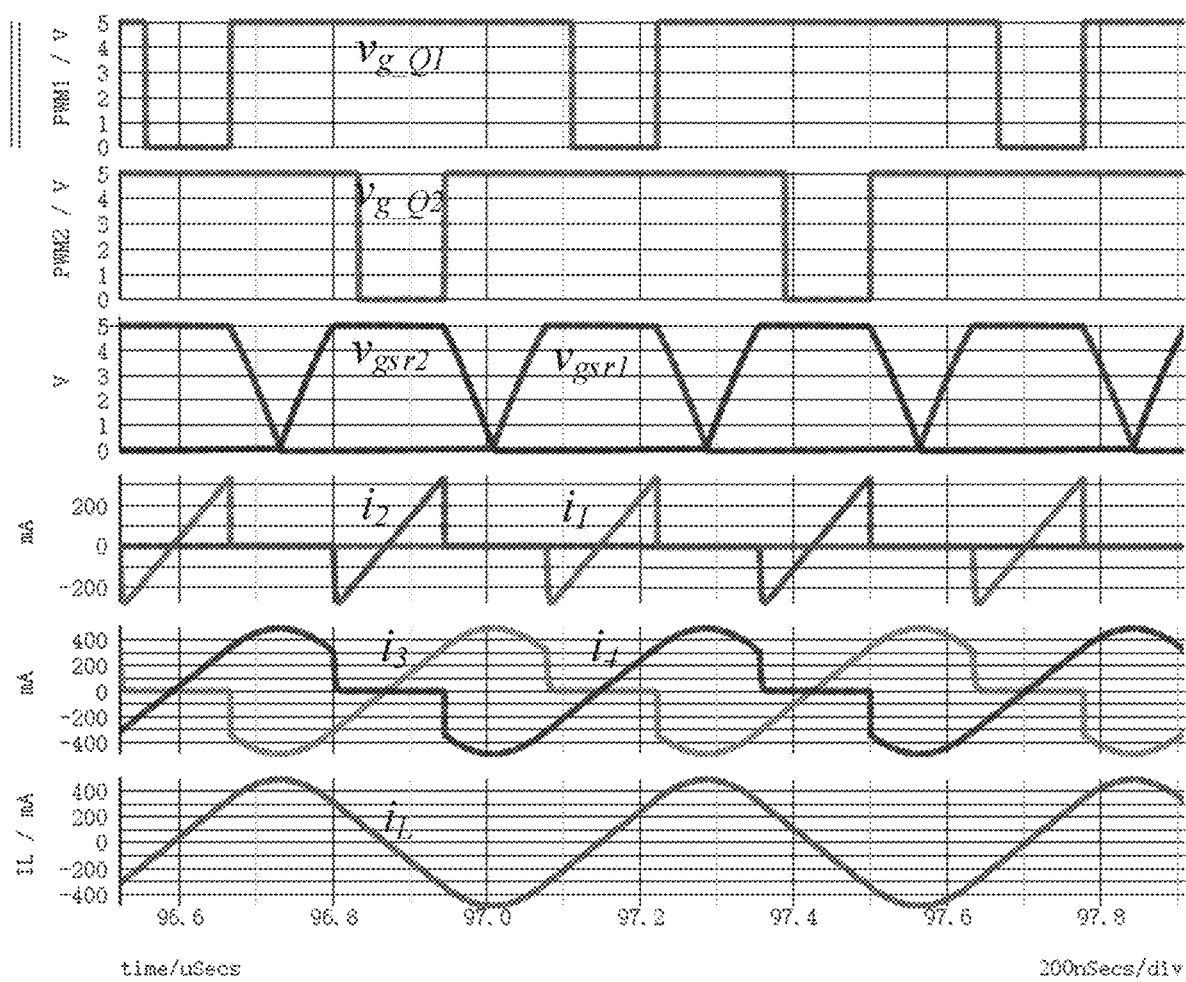
FIG. 5 is a simulated diagram of the key waveforms of the circuit according to the invention.
Figure 6A:
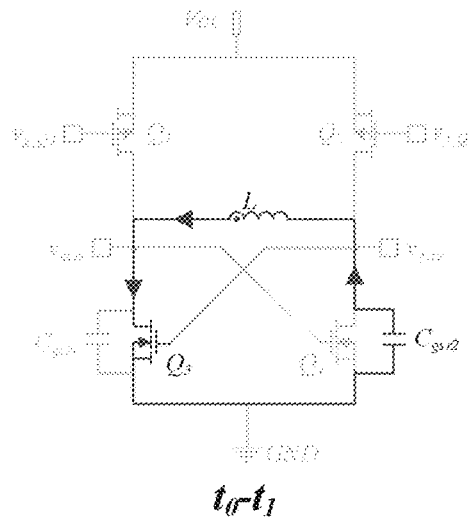
FIGS. 6A-6F illustrate current loops in different modes of the circuit according to the invention.
In the FIGS.: 1, PMOS drive network; 2, NMOS clamping circuit.
Figure 6B:
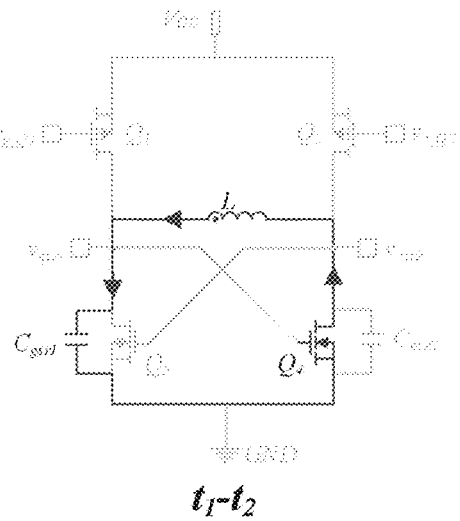
Figure 6C:
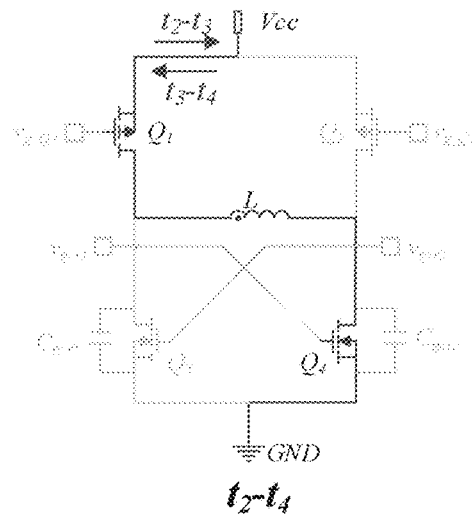
Figure 6D:
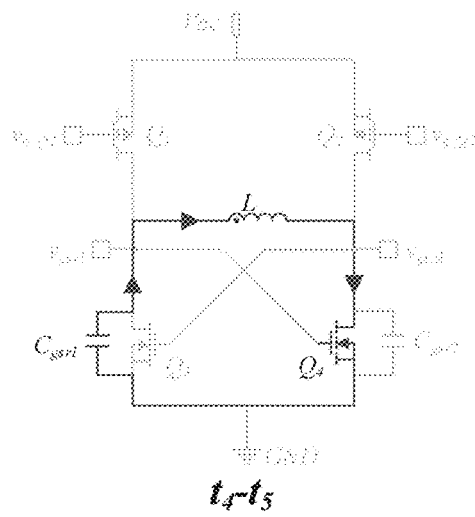
Figure 6E:
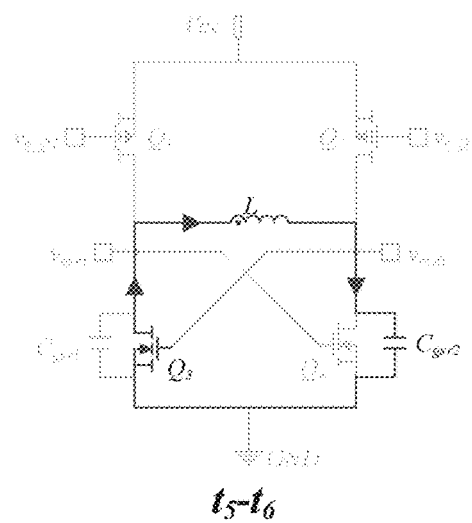
Figure 6F:
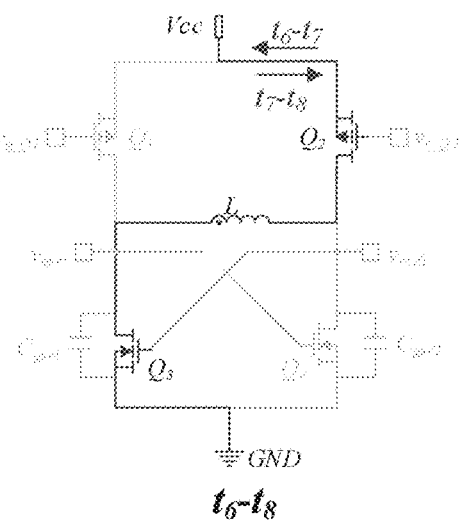

As shown in FIG. 5 which a simulated diagram of the waveforms on software SIMetrix according to the circuit in FIG. 1 and the control signals in FIG. 4, the simulated waveforms are identical with the waveforms analyzed in the timing diagram in FIG. 4, further verifying the validity of the circuit of the invention.

FIGS. 6A-6F illustrate current loops at different time phases corresponding to FIG. 4. Eight different circuit modes generated by changes of signals at input ports $v_{g\_Q1}$ and $v_{g\_Q2}$ of the non-isolated resonant gate drive circuit are analyzed below in conjunction with FIG. 4 and FIGS. 6A-6F.

During $t_0$-$t_1$, the initial voltage of the gate capacitor $C_{gsr2}$ is Vcc, the initial voltage of the capacitor $C_{gsr1}$ is 0, the first NMOS transistor $Q_3$ is turned on, the other three MOS transistors are turned off, the gate capacitor $C_{gsr2}$ and the inductor L form resonance, the gate capacitor $C_{gsr2}$ is discharged resonantly, the inductor L is charged resonantly, the voltage of the output port $v_{gsr2}$ drops, and the current of the resonant inductor rises. Energy is transferred from the gate capacitor $C_{gsr2}$ to the inductor until the gate capacitor $C_{gsr2}$ is completely discharged.

During $t_1$-$t_2$, the initial voltage of the gate capacitor $C_{gsr1}$ and the initial voltage of the gate capacitor $C_{gsr2}$ are both 0, the second NMOS transistor $Q_4$ is turned on, the other three MOS transistors are turned off, the gate capacitor $C_{gsr1}$ and the inductor L form resonance, the inductor L is discharged resonantly, the gate capacitor $C_{gsr1}$ is charged resonantly, the voltage of the output port $v_{gsr1}$ rises, and the current of the resonant inductor drops. Energy is transferred from the inductor L to the gate capacitor $C_{gsr1}$ until the voltage of the gate capacitor $C_{gsr1}$ rises to Vcc.

During $t_2$-$t_3$, the first PMOS transistor $Q_1$ and the second NMOS transistor $Q_4$ are turned on, the voltage of the gate capacitor $C_{gsr1}$ is maintained at Vcc, and the voltage of the gate capacitor $C_{gsr2}$ is maintained at 0, such that the output port $v_{gsr1}$ is maintained at a high level and the output port $v_{gsr2}$ is maintained at a low level. Energy on the inductor L is recovered by a power supply Vcc, and the current flows to the power supply until the current decreases to 0.

During ta-ta, the on-off state of the MOS transistors and the voltage of the output ports are the same as those during $t_2$-$t_3$, the current direction is opposite to the current direction during $t_2$-$t_3$, the inductor is charged by the power supply Vcc, and the current across the inductor increases until the first PMOS transistor $Q_1$ is turned off.

During $t_4$-$t_5$, the initial voltage of the gate capacitor $C_{gsr1}$ is Vcc, the initial voltage of the capacitor $C_{gsr2}$ is 0, the second NMOS transistor $Q_4$ is turned on, the other three MOS transistors are turned off, the gate capacitor $C_{gsr1}$ and the inductor L form resonance, the gate capacitor $C_{gsr1}$ is discharged resonantly, the inductor L is charged resonantly, the voltage of the output port $v_{gsr1}$ drops, and the current of the resonant inductor rises. Energy is transferred from the gate capacitor $C_{gsr1}$ to the inductor L until the gate capacitor $C_{gsr1}$ is discharged completely.

During $t_6$-$t_7$, the initial voltage of the gate capacitor $C_{gsr1}$ and the initial voltage of the gate capacitor $C_{gsr2}$ are both 0, the first NMOS transistor $Q_3$ is turned on, the other three MOS transistors are turned off, the gate capacitor $C_{gsr2}$ and the inductor L form resonance, the inductor L is discharged resonantly, the gate capacitor $C_{gsr1}$ is charged resonantly, the voltage of the output port $v_{gsr2}$ rises, and the current of the resonant inductor drops. Energy is transferred from the inductor L to the gate capacitor $C_{gsr2}$ until the voltage of the gate capacitor $C_{gsr2}$ rises to Vcc.

During $t_6$-$t_7$, the second PMOS transistor $Q_2$ and the first NMOS transistor $Q_3$ are turned on, the voltage of the gate capacitor $C_{gsr2}$ is maintained at Vcc, and the voltage of the gate capacitor $C_{gsr1}$ is maintained at 0, such that the output port $v_{gsr2}$ is maintained at a high level and the output port $v_{gsr1}$ is maintained at a low level. Energy on the inductor L is recovered by the power supply Vcc, and the current flows to the power supply until the current decreases to 0.

During $t_7$-$t_8$, the on-off state of the MOS transistors and the voltage of the output ports are the same as those during $t_6$-$t_7$, the current direction is opposite to the current direction during $t_6$-$t_7$, the inductor is charged by the power supply Vcc, and the current across the inductor increases until the second PMOS transistor $Q_2$ is turned off.

To sum up, in the invention, the inductor forms LC resonance together with the gate capacitor $C_{gsr1}$ and the gate capacitor $C_{gsr2}$ in the NMOS clamping circuit to realize energy recovery, thus greatly reducing the drive loss; and output drive signals provided by the invention can drive low-voltage side switching transistors on the primary side and synchronous rectifying transistors on the secondary side of the LLC direct-current transformer.

According to the invention, the number of devices is small, the entire non-isolated resonant gate drive circuit is formed by two PMOS transistors, two NMOS transistors and an inductor, the magnetic element only comprises an inductor, and a transformer is not needed, such that the cost and space are reduced, and miniaturization and integration are facilitated; moreover, control signals in the invention are simple, the function generator connected to the drive chip provides two square signals with a phase difference of 180° and the same frequency and duty cycle to control the two PMOS drive transistors, and it is unnecessary to provide control signals for the two NMOS transistors, such that the complexity of the control signals is simplified, and the stability of the system is improved.

The above embodiments are merely preferred ones of the invention. It should be pointed out that those ordinarily skilled in the art can make some improvements and embellishments to the invention without departing from the principle of the invention, and all these improvements and embellishments should fall within the protection scope of the invention.

What is claimed is:

1. A non-isolated resonant gate drive circuit, comprising a P-channel metal oxide semiconductor (PMOS) drive network, an N-channel metal oxide semiconductor (NMOS) clamping circuit and an inductor, the PMOS drive network and the NMOS clamping circuit being connected in parallel to two terminals of the inductor;
   wherein input signals of the PMOS drive network are provided by a function generator connected to a drive chip, drive signals are output via an output port $v_{gsr1}$ and an output port $v_{gsr2}$ after the input signals are processed by the PMOS drive network, the NMOS clamping circuit and the inductor, the NMOS clamping circuit is configured for controlling a state of the output port $v_{gsr1}$ and the output port $v_{gsr2}$ to change, the inductor forms LC resonance together with a capacitor $C_{gsr1}$ and a capacitor $C_{gsr2}$ in the NMOS clamping circuit to recover energy in a process of turning off the drive circuit, and the recovered energy is used in a process of turning on the drive circuit;
   wherein the output port $v_{gsr1}$ is connected to one terminal of the inductor and a drain of a first PMOS transistor, and the output port $v_{gsr2}$ is connected to the other terminal of the inductor and a drain of a second PMOS transistor.

2. The non-isolated resonant gate drive circuit according to claim 1, wherein the PMOS drive network comprises the first PMOS transistor and the second PMOS transistor, a source of the first PMOS transistor and a source of the second PMOS transistor are both connected to a power supply Vcc, a gate of the first PMOS transistor is connected to a pulse width modulation (PWM)1 output port of the drive chip connected to the function generator, the drain of the first PMOS transistor is connected to one terminal of the inductor, a gate of the second PMOS transistor is connected to a PWM2 output port of the drive chip connected to the function generator, and the drain of the second PMOS transistor is connected to the other terminal of the inductor.

3. The non-isolated resonant gate drive circuit according to claim 1, wherein the NMOS clamping circuit comprises a first NMOS transistor, a second NMOS transistor, the capacitor $C_{gsr1}$ and the capacitor $C_{gsr2}$,
   a gate of the first NMOS transistor is connected to a drain of the second NMOS transistor, the other terminal of the inductor, the output port $v_{gsr2}$, the drain of the second PMOS transistor and one terminal of the capacitor $C_{gsr2}$,
   a drain of the first NMOS transistor is connected to a gate of the second NMOS transistor, one terminal of the inductor, the output port $v_{gsr1}$, the drain of the first PMOS transistor and one terminal of the capacitor $C_{gsr1}$,
   a source of the first NMOS transistor is connected to the other terminal of the capacitor $C_{gsr1}$ and ground (GND),
   the gate of the second NMOS transistor is connected to one terminal of the inductor, the output port $v_{gsr1}$, the drain of the first PMOS transistor and the capacitor $C_{gsr1}$, the drain of the second NMOS transistor is connected to the other terminal of the inductor, the output port $v_{gsr2}$, the drain of the second PMOS transistor and one terminal of the capacitor $C_{gsr2}$,
   a source of the second NMOS transistor is connected to the other terminal of the capacitor $C_{gsr2}$ and GND,
   one terminal of the capacitor $C_{gsr1}$ is connected to one terminal of the inductor, the output port $v_{gsr1}$ and the drain of the first PMOS transistor, and one terminal of the capacitor $C_{gsr2}$ is connected to the other terminal of the inductor, the output port $v_{gsr2}$ and the drain of the second PMOS transistor.

\* \* \* \* \*